United States Patent
Yamashita et al.

(10) Patent No.: US 8,148,994 B2
(45) Date of Patent: Apr. 3, 2012

(54) DEVICE AND METHOD FOR DETERMINING REPLACEMENT OF STORAGE BATTERY

(75) Inventors: Akira Yamashita, Kanagawa (JP);
Takahisa Shodai, Kanagawa (JP);
Akihiro Miyasaka, Kanagawa (JP);
Riichi Kitano, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 562 days.

(21) Appl. No.: 12/225,755

(22) PCT Filed: Apr. 24, 2007

(86) PCT No.: PCT/JP2007/058830
§ 371 (c)(1),
(2), (4) Date: Sep. 26, 2008

(87) PCT Pub. No.: WO2007/125906
PCT Pub. Date: Nov. 8, 2007

(65) Prior Publication Data
US 2010/0231226 A1    Sep. 16, 2010

(30) Foreign Application Priority Data
Apr. 25, 2006  (JP) ................. 2006-120327

(51) Int. Cl.
*G01N 27/00* (2006.01)
*H02J 7/00* (2006.01)

(52) U.S. Cl. ........ 324/433; 324/426; 324/441; 320/132; 320/134; 702/63

(58) Field of Classification Search .......... 324/425–450; 320/127–136; 703/63
See application file for complete search history.

(56) References Cited

U.S. PATENT DOCUMENTS

| | | | | |
|---|---|---|---|---|
| 5,675,258 A | * | 10/1997 | Kadouchi et al. | 324/433 |
| 6,160,383 A | * | 12/2000 | Carkner | 320/150 |
| 6,194,870 B1 | * | 2/2001 | Kim | 320/134 |
| 6,789,026 B2 | * | 9/2004 | Barsoukov et al. | 702/63 |
| 6,791,300 B2 | * | 9/2004 | Trinh et al. | 320/151 |
| 7,624,292 B2 | * | 11/2009 | Nishida | 713/340 |

(Continued)

FOREIGN PATENT DOCUMENTS

| | | |
|---|---|---|
| JP | 10-221418 A | 8/1998 |
| JP | 2004-222427 A | 8/2004 |
| JP | 2004-279406 A | 10/2004 |

OTHER PUBLICATIONS

Saito et al., "High Performance Backup Power Supply System", Proceedings fo INTELEC' 03 (The 25th International Telecommunications Energy Conference), pp. 261-267, 2003.

(Continued)

*Primary Examiner* — Huy Q Phan
*Assistant Examiner* — Emily Chan
(74) *Attorney, Agent, or Firm* — Blakely, Sokoloff, Taylor & Zafman

(57) ABSTRACT

A control unit (16) of a replacement determination device charges one or more battery modules (10) as determination targets, and measures the voltage change value of the battery module (10) in a predetermined period of time from the time of stoppage of charge by using a voltage measuring device (14). If the voltage change value becomes equal to or more than a reference voltage change value consecutively a predetermined number of times which is equal to or more than one, the control unit determines that the battery module (10) needs to be replaced.

26 Claims, 10 Drawing Sheets

U.S. PATENT DOCUMENTS

2005/0225289 A1* 10/2005 Iida et al. .................... 320/116
2009/0070052 A1* 3/2009 Taniguchi et al. ............. 702/63

OTHER PUBLICATIONS

Nishio, "Deterioration Mechanism of Nickel Hydrogen Battery", Proceedings of '97 Battery Technology Symposium, pp. 5-2-1-5-2-13, 1997.

Yamashita et al., "Capacity Estimation of Nickel Metal Hydride Backup Batteries", Proceedings of INTELEC' 03 (The 25th International Telecommunications Energy Conference), pp. 739-743, 2003.

Yamashita et al., "Capacity Estimation and Lifetime Expectancy of Large-Scale Nickel Metal Hydride Backup Batteries", Proceedings of INTELEC' 05 (The 27th International Telecommunications Energy Conference), pp. 291-295, 2005.

* cited by examiner

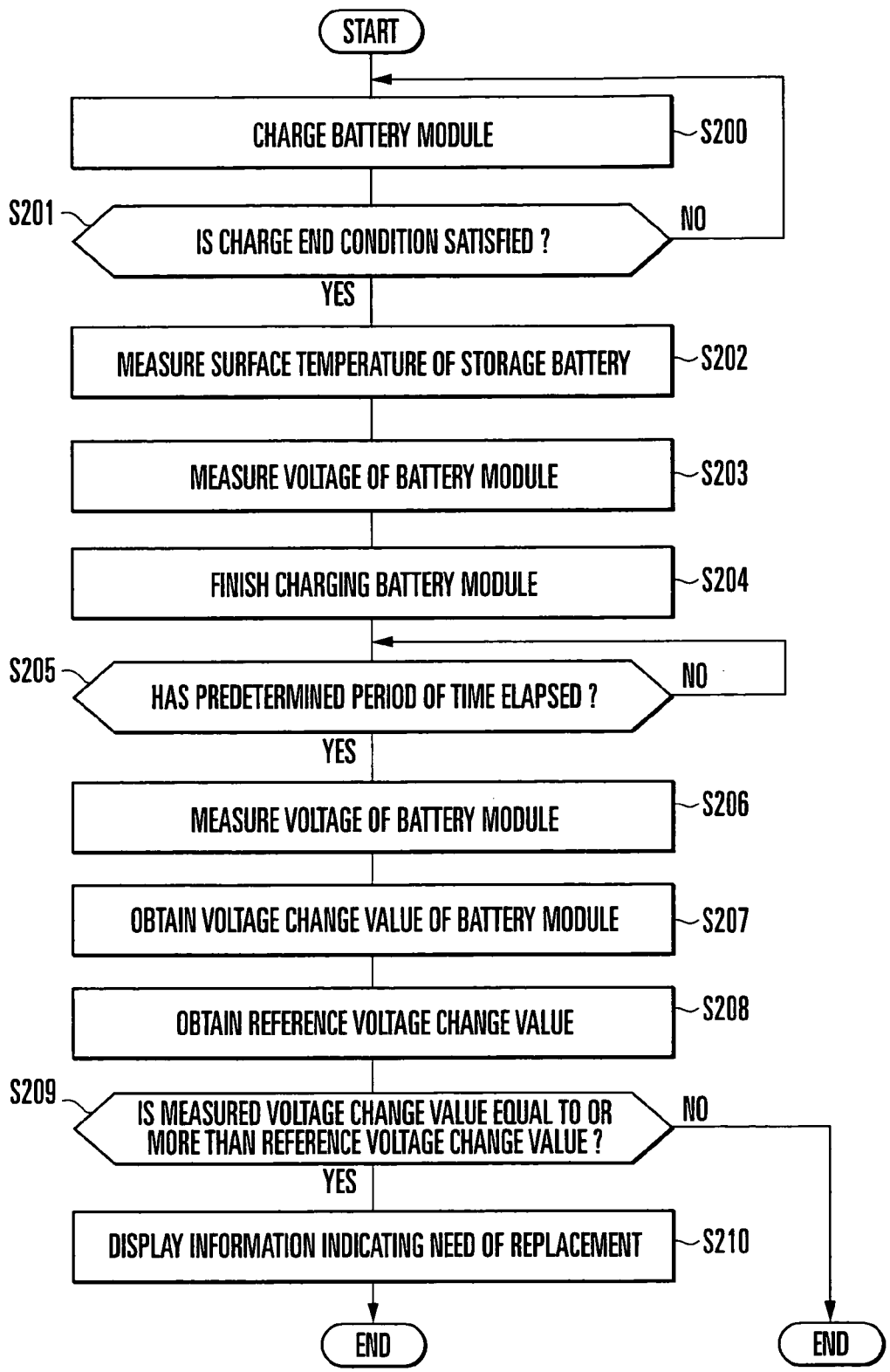
F I G. 8

DEVICE AND METHOD FOR DETERMINING REPLACEMENT OF STORAGE BATTERY

The present patent application is a Utility claiming the benefit of Application No. PCT/JP2007/058830, filed Apr. 24, 2007.

TECHNICAL FIELD

The present invention relates to a device and method for determining replacement of a storage battery such as a nickel metal hydride storage battery used as a secondary battery such as a backup battery.

BACKGROUND ART

A secondary battery for backup is preferably always kept in a state near the fully charged state in consideration of its application purpose. However, a secondary battery deteriorates due to long-term use, and the capacity of the secondary battery decreases. For this reason, it is necessary to replace the secondary battery whose capacity has become less than a predetermined capacity. It is therefore necessary to measure the capacity upon discharge of the secondary battery. However, the discharge of the secondary battery should be restricted to the necessary minimum. In a 10 kWh system for a cellular phone base station which uses a nickel metal hydride battery as a secondary battery for backup, two series of battery modules equipped with nickel metal hydride storage batteries are installed. The two-series battery modules are connected in parallel with a load and a battery charger. A conventional system uses a method of periodically measuring the capacity of each nickel metal hydride storage battery upon fully discharging the nickel metal hydride storage battery in one of the two-series battery modules (see reference: K. Saito, T. Shodai, A. Yamashita, and H. Wakaki, Proceedings of INTELEC '03 (The 25th International Telecommunications Energy Conference), p. 261, 2003). In this manner, the necessity of replacement of a nickel metal hydride storage battery is determined.

A nickel metal hydride storage battery is known to increase in internal resistance due to deterioration. That is, measuring the internal resistance of the nickel metal hydride storage battery can indirectly determine the necessity of replacement of the nickel metal hydride storage battery without discharging it. However, it is not easy to accurately measure the internal resistance of a nickel metal hydride storage battery. Furthermore, any concrete relationship between the internal resistance and the capacity of a nickel metal hydride storage battery was not known (see reference: Koji Nishio, Proceedings of '97 Battery Technology Symposium, p. 5-2-1, 1997).

Thereafter, the reference "A. Yamashita, H. Wakaki, K. Saito, and T Shodai, Proceedings of INTELEC '03 (The 25th International Telecommunications EnergyConference), p. 739, 2003" discloses that there is a relationship between a voltage drop amount after the end of charge and a capacity which has decreased due to deterioration. In addition, a method of correcting a voltage drop amount due to the temperature at the time of charge is proposed in "A. Yamashita, H. Wakaki, K. Saito, and T Shodai, Proceedings of INTELEC '05 (The 27th International Telecommunications Energy Conference), p. 291, 2005".

DISCLOSURE OF INVENTION

Problem to be Solved by the Invention

According to the above method of measuring the capacity of a nickel metal hydride storage battery upon discharge, i.e., the method of determining the necessity of replacement of a nickel metal hydride storage battery upon discharge, the capacity of each nickel metal hydride storage battery is measured upon full discharge of the nickel metal hydride storage battery in one of the two-series battery modules. During capacity measurement, therefore, only one of the nickel metal hydride storage batteries is fully charged. When an accident or the like occurs during capacity measurement, power can be supplied from only one nickel metal hydride storage battery. During this period, the backup time shortens.

A system in which two-series battery modules are not connected in parallel with each other cannot use the above method of determining the necessity of replacement of a nickel metal hydride storage battery upon discharge. In addition, even in a system in which N-series battery modules are connected in parallel with each other, when the capacity of a nickel metal hydride storage battery in each series is to be separately measured, an N-fold current generally concentrates on one nickel metal hydride storage battery. This makes it impossible to use the above method of determining the necessity of replacement of a nickel metal hydride storage battery upon discharge unless the nickel metal hydride storage batteries to be used are capable of discharging large currents or the system to be used is designed in consideration of a very long backup time. Therefore, the use of the above method of determining the necessity of replacement of a nickel metal hydride storage battery upon discharge is limited.

In determining the necessity of replacement of a nickel metal hydride storage battery on the basis of the relationship between the voltage drop amount after the end of charge of the nickel metal hydride storage battery and the capacity which has decreased due to deterioration, the capacity which has decreased due to deterioration is calculated from the voltage drop amount after the end of charge. However, since the voltage drop amount changes depending on the temperature, an error is included in the calculated capacity. It is therefore undeniable that an error will occur in replacement determination. Using a method of correcting a voltage drop amount depending on the temperature at the time of charge makes it possible to determine the necessity of replacement of a nickel metal hydride storage battery while preventing the occurrence of an error in replacement determination without discharging a nickel metal hydride storage battery. However, the voltage drop amount after the end of charge of a nickel metal hydride storage battery changes depending on the degree of deterioration of the nickel metal hydride storage battery and the temperature at the time of charge. Therefore, using the method of correcting a voltage drop amount depending on the temperature at the time of charge makes it necessary to collect measurement data about a voltage drop amount after the end of charge for each degree of deterioration of the nickel metal hydride storage battery and for each temperature at the time of charge. This requires complicated mathematical expressions and tables for correction. As a consequence, it becomes impossible to implement this method.

It has therefore been difficult to indirectly determine the necessity of replacement of a nickel metal hydride storage battery by a means other than the means of discharging the battery. The above problem can occur in storage batteries other than nickel metal hydride storage batteries.

The present invention has been made in consideration of the above problems, and has as its object to provide a replacement determination device and method for a storage battery, which can easily determine the necessity of replacement of a storage battery without discharging a storage battery such as a nickel metal hydride storage battery.

Means of Solution to the Problem

A device for determining replacement of a storage battery according to the present invention comprises charging means for charging not less than one storage battery as a determination target, voltage measuring means for measuring a voltage change value of the storage battery in a predetermined period of time after the time of stoppage of charge of the storage battery, and determination means for determining that the storage battery needs to be replaced, when the voltage change value becomes not less than a reference voltage change value consecutively a predetermined number of times which is not less than one.

A method for determining replacement of a storage battery according to the present invention comprises the first charging step of charging not less than one storage battery as a determination target, the first voltage measuring step of measuring a voltage change value of the storage battery in a predetermined period of time after the time of stoppage of charge of the storage battery, and the determination step of determining that the storage battery needs to be replaced, when the voltage change value becomes not less than a reference voltage change value consecutively a predetermined number of times which is not less than one.

Effects of the Invention

The present invention can be applied to any system configuration because it does not discharge a storage battery, and can easily determine the necessity of replacement of a storage battery at the time of, for example, auxiliary charge. In addition, according to the present invention, if it is determined that a storage battery needs to be replaced when a voltage change equal to or more than a reference voltage change value occurs consecutively a predetermined number of times, it is possible to reduce determination errors due to errors in measurement on the surface temperature and the voltage change value.

Furthermore, according to the present invention, since the relationship between the surface temperature of a storage battery whose capacity has become less than a replacement reference capacity value and the voltage change value is obtained, and the necessity of replacement of a storage battery is determined from the obtained relationship, no error is included in replacement determination on a storage battery due to a temperature change. This can prevent the occurrence of a replacement determination error.

In the present invention, since the above relationship is approximated by a surface temperature function f(T), the necessity of replacement of a storage battery can be easily determined.

The present invention uses parabolic equation $f(T)=aT^2-bT+c$ obtained by optimizing the function f(T) by the least squares method, and hence can easily determine the necessity of replacement of a storage battery. According to the present invention, the relationship between the surface temperature of a storage battery and the voltage change value of the storage battery is approximated by the surface temperature function f(T), and the function f(T) is optimized into parabolic equation $f(T)=aT^2-bT+c$ by the least squares method. This makes it possible to obtain the relationship between the surface temperature of a storage battery and the voltage change value of the storage battery in correspondence with a predetermined replacement reference capacity regardless of the degree of deterioration of the storage battery. Consequently, the present invention suffices to repeatedly charge a storage battery whose capacity has decreased to the replacement reference capacity and measure the surface temperature and the voltage change value while changing the ambient temperature regardless of the degree of deterioration of the storage battery, and can easily calculate a reference voltage change value for the determination of the necessity of replacement of a storage battery. In addition, according to the present invention, if a storage battery as a determination target is of the same type as that of a storage battery which has been used in advance for measurement in this manner with the ambient temperature being changed, the relationship between the surface temperature of the storage battery as the determination target and the voltage change value can be optimized by parabolic equation $f(T)=aT^2-bT+c$ obtained from the storage battery used for the prior measurement. This obviates the necessity to perform measurement on a storage battery as a determination target in advance, and allows easy determination of the necessity of replacement of the storage battery as the determination target.

The present invention can easily calculate a reference voltage change value by substituting the surface temperature of a storage battery as a determination target into the function f(T), and hence can easily determine the necessity of replacement of the storage battery. The present invention need not correct a voltage change amount due to the temperature at the time of charge, and requires no complicated mathematical expressions or tables. This makes it possible to easily determine the necessity of replacement of a storage battery.

Furthermore, the present invention can reduce determination errors due to variations among a plurality of storage batteries because it determines that a storage battery needs to be replaced, when the measured voltage change values of a predetermined number of storage batteries, of the plurality of storage batteries, become equal to or more than a reference voltage change value. The present invention can therefore accurately determine the necessity of replacement of a storage battery in one operation.

Moreover, the present invention can quickly determine the necessity of replacement of a storage battery while reducing variations in measured surface temperature and measured voltage change value by setting a predetermined elapsed time from the end or interruption of charge to five min to one hr.

BRIEF DESCRIPTION OF DRAWINGS

FIG. 8 is a flowchart showing the operation of the replacement determination device in FIG. 6;

BEST MODE FOR CARRYING OUT THE INVENTION

Figure 1:
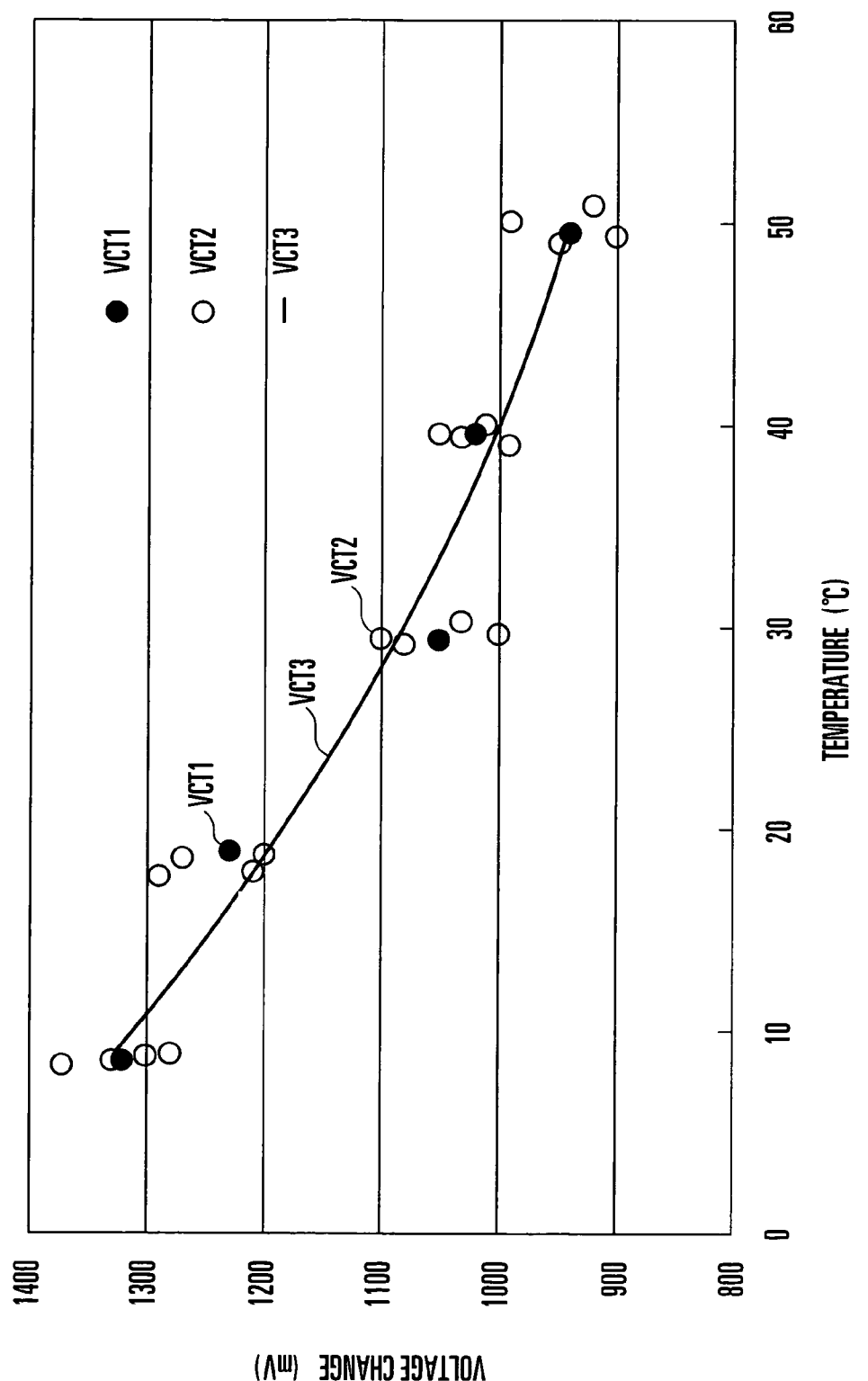
FIG. 1 is a graph showing the relationship between the surface temperature of a nickel metal hydride storage battery in a battery module at the end of charge and the voltage change of the battery module in three min after the end of charge.

A device and method for determining replacement of a nickel metal hydride storage battery according to the present invention will be described by exemplifying replacement determination in a battery system including a battery module having a nominal capacity of 95 Ah, in which 10 nickel metal hydride storage battery cells are connected in series with each other.

First Embodiment

A method of charging a nickel metal hydride storage battery for backup will be described first. In general, trickle charge is used for a small nickel metal hydride storage battery. In contrast, for a large nickel metal hydride storage battery, an intermittent charge method is often used, in which the battery is charged with a constant current of about 0.1 C or 0.2 C up to a fully charged state, the battery is self-discharged thereafter, and then the battery is charged again with a constant current when the voltage or depth of discharge decreases to a given value by self-discharge. A battery module included in a battery system according to the first embodiment is charged by the above intermittent charge method. In addition, this battery module uses the dT/dt method as a method of detecting full charge, i.e., a method of finishing charge when a temperature rise in a predetermined period of time exceeds a predetermined value. This can minimize the overcharge of a nickel metal hydride storage battery. In a battery module included in a battery system according to the first embodiment, after first-stage charging operation based on the above intermittent charge method, which is executed until a nickel metal hydride storage battery is fully charged, is finished by the dT/dt method, second-stage charging operation is executed with a low current of about 0.03 C for about two hr. This reduces variations in fully charged state among the respective cells.

The deterioration of a nickel metal hydride storage battery will be described next. The deterioration of a nickel metal hydride storage battery for backup is known to mainly manifest as a decrease in electrolyte and the corrosion of a hydrogen absorbing alloy in the negative electrode. As the above electrolyte decreases and the hydrogen absorbing alloy in the negative electrode corrodes, the internal impedance of the nickel metal hydride storage battery changes. That is, a capacity which has decreased due to the deterioration of a nickel metal hydride storage battery can be measured by measuring the internal impedance of the nickel metal hydride storage battery. Although an AC impedance method with frequency scanning is used to accurately measure an internal impedance, there is available, as a simpler measurement method, a method of measuring an AC impedance with a fixed frequency or a method of measuring a voltage using DC pulses. In the method of measuring a voltage by using DC pulses, constant-current charge or constant-current discharge is used, and a rise or fall voltage at the start of charge/discharge or at the end of charge is measured.

The internal impedance of a nickel metal hydride storage battery for backup can also be measured in the same manner by measuring a voltage change at the start or end of charge or discharge in practical use instead of using DC pulses. When a voltage change in a predetermined period of time from the end of constant-current charge in the above intermittent charge method is measured, since the current value is constant and the state of charge (SOC) is always almost 100%, a condition other than the voltage which changes is only a surface temperature T. This can lead to the relationship between the surface temperature T of the nickel metal hydride storage battery in a battery module at the end of constant-current charge in the above intermittent charge method, the voltage change of the battery module in a predetermined period of time after the end of charge, and the capacity which has decreased due to the deterioration of the nickel metal hydride storage battery.

For an experiment, the following cycle was repeated three times for the above battery module with each of the rest times between charge and discharge being set to three hr: performing first-stage charging operation with a charging current of 20 A under the charge end condition of dT/dt=0.3° C./min, performing second-stage charging operation for a charge time of two hr, and discharging the module with a discharging current of 30 A and a discharge end voltage of 10.0 V. As a result, the capacity at the time of discharge in the final cycle was 93.7 Ah. The above battery module is caused to deteriorate by repetitive execution of self-discharge with a depth of discharge of about 20% at 55° C. and first-state charging operation with a charging current of 20 A at 25° C. If the battery module has deteriorated due to a decrease in capacity, replacement reference capacity value as a criterion for the replacement of the above battery module is set to 70 Ah. At the stage where the capacity of the above battery module decreased to 69.7 Ah below the replacement reference capacity value (70 Ah) due to self-discharge with a depth of discharge of about 20% and deterioration, first-stage charging operation was executed after the ambient temperature was made constant, and the surface temperature T of the nickel metal hydride storage battery in the above battery module at the end of discharge and the difference between the voltage value of the battery module at the end of discharge and the voltage value of the battery module in a predetermined period of time from the end of charge, i.e., a voltage change value V of the battery module after the lapse of a predetermined period of time from the end of charge, were measured. In addition, the measurement of the surface temperature T at the end of the first-stage charging operation, which was executed after the ambient temperature was made constant, and the voltage change value V in a predetermined period of time after the end of charge was repeatedly executed while the ambient temperature was changed to set the surface temperature T of the battery module to 10° C. to 50° C. Note that the above predetermined period of time was set to three min, five min, 10 min, 30 min, and one hr.

Figure 2:
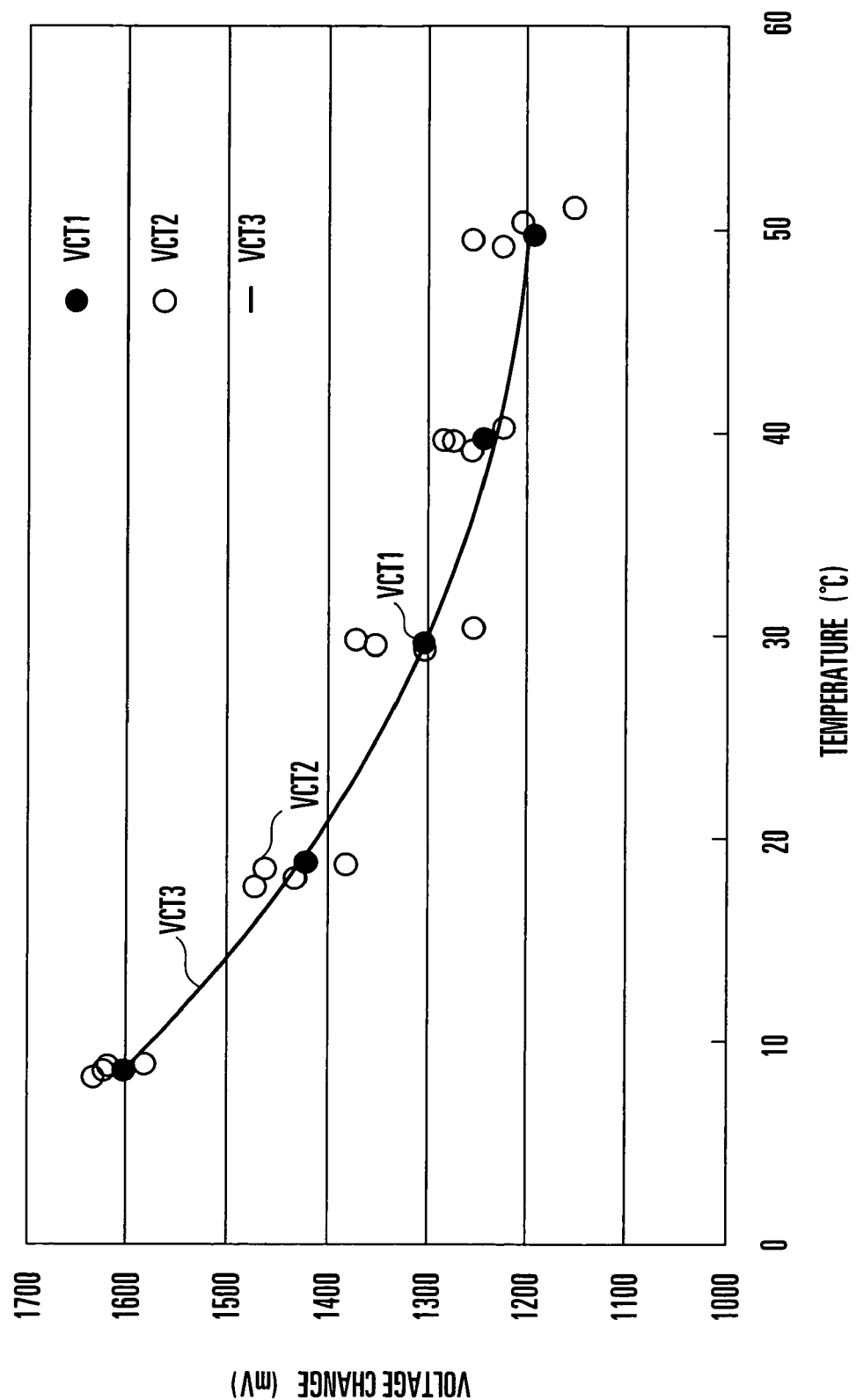
FIG. 2 is a graph showing the relationship between the surface temperature of the nickel metal hydride storage battery in the battery module at the end of charge and the voltage change of the battery module in five min after the end of charge.
Figure 3:
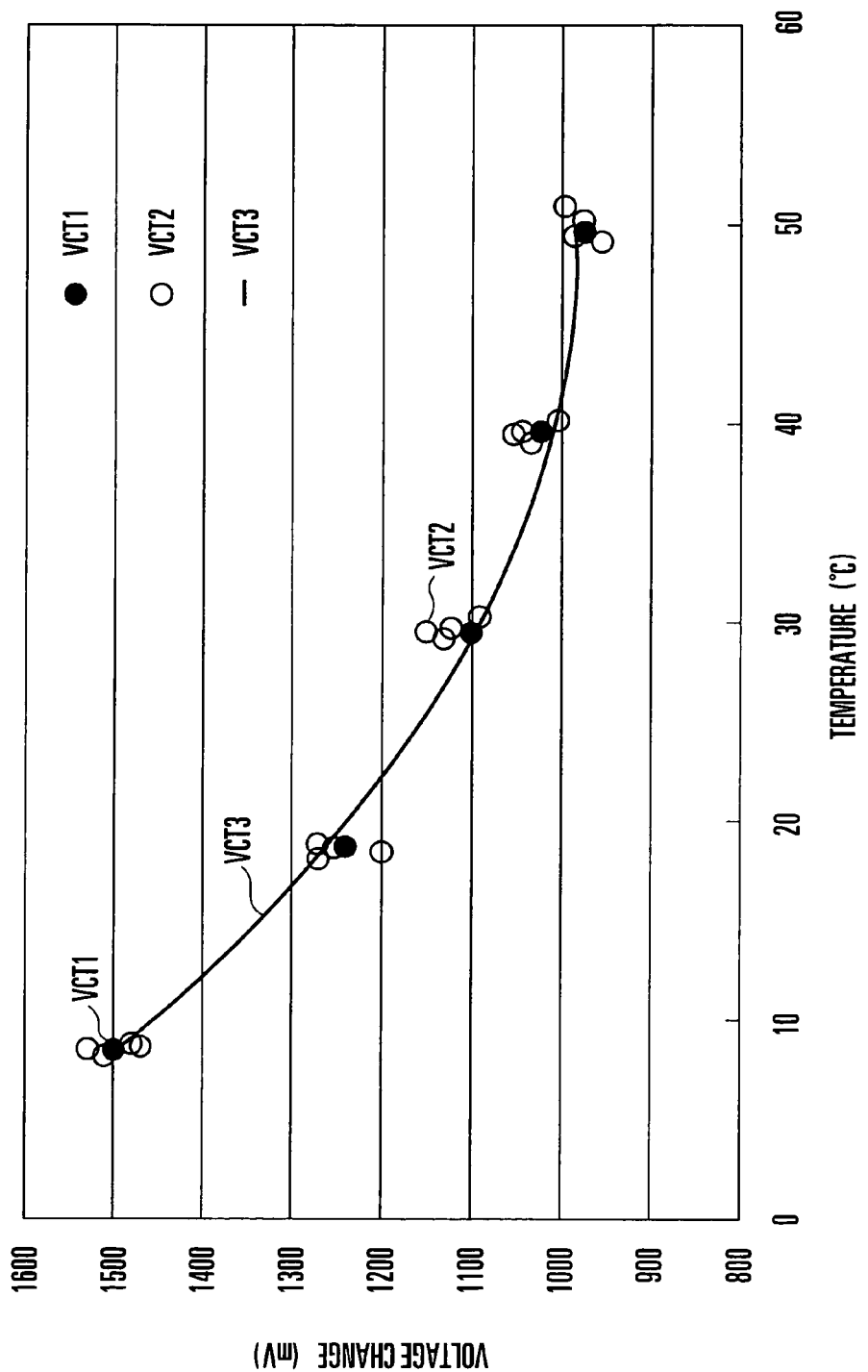
FIG. 3 is a graph showing the relationship between the surface temperature of the nickel metal hydride storage battery in the battery module at the end of charge and the voltage change of the battery module in 10 min after the end of charge.
Figure 4:
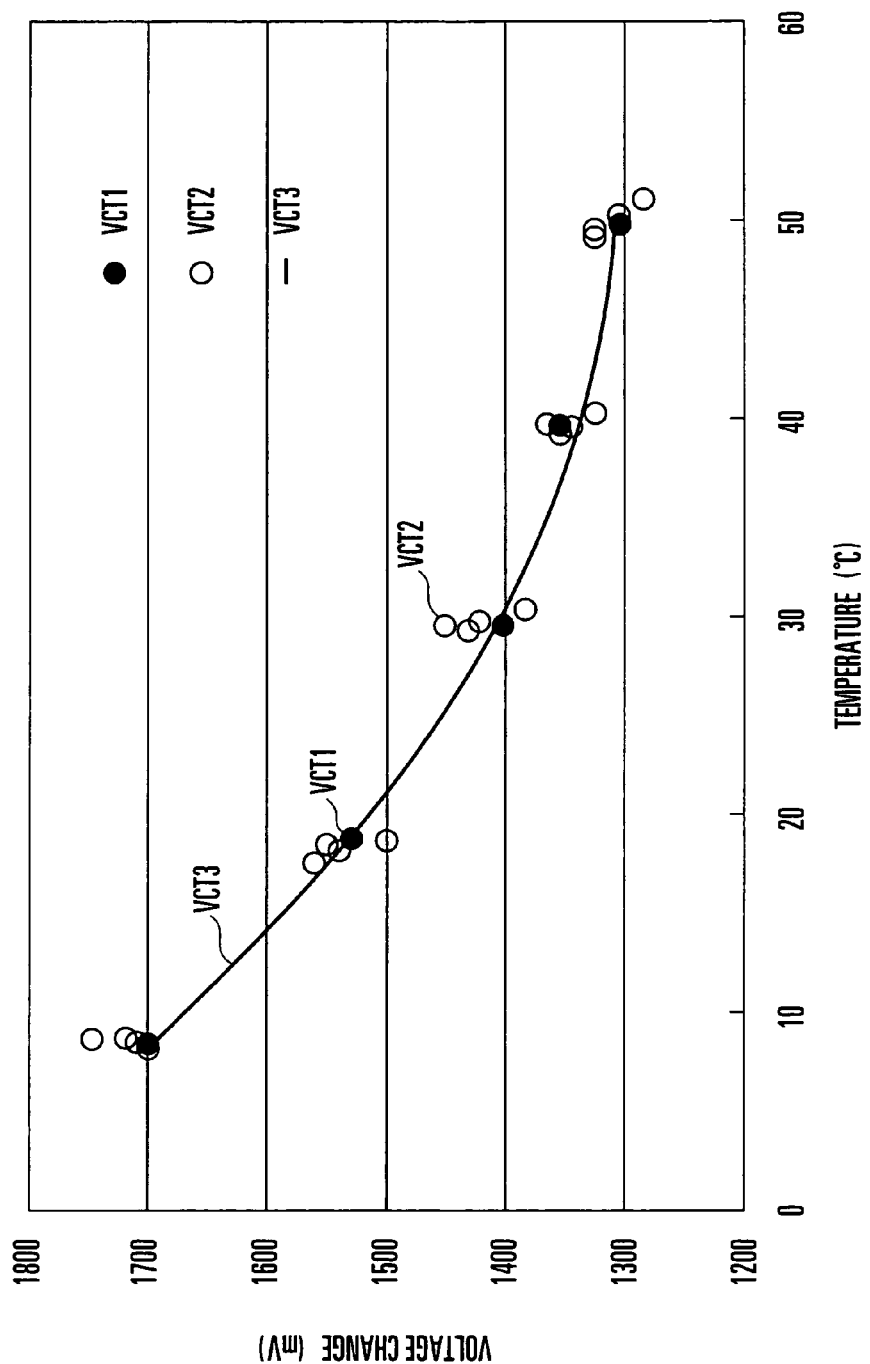
FIG. 4 is a graph showing the relationship between the surface temperature of the nickel metal hydride storage battery in the battery module at the end of charge and the voltage change of the battery module in 30 min after the end of charge.
Figure 5:
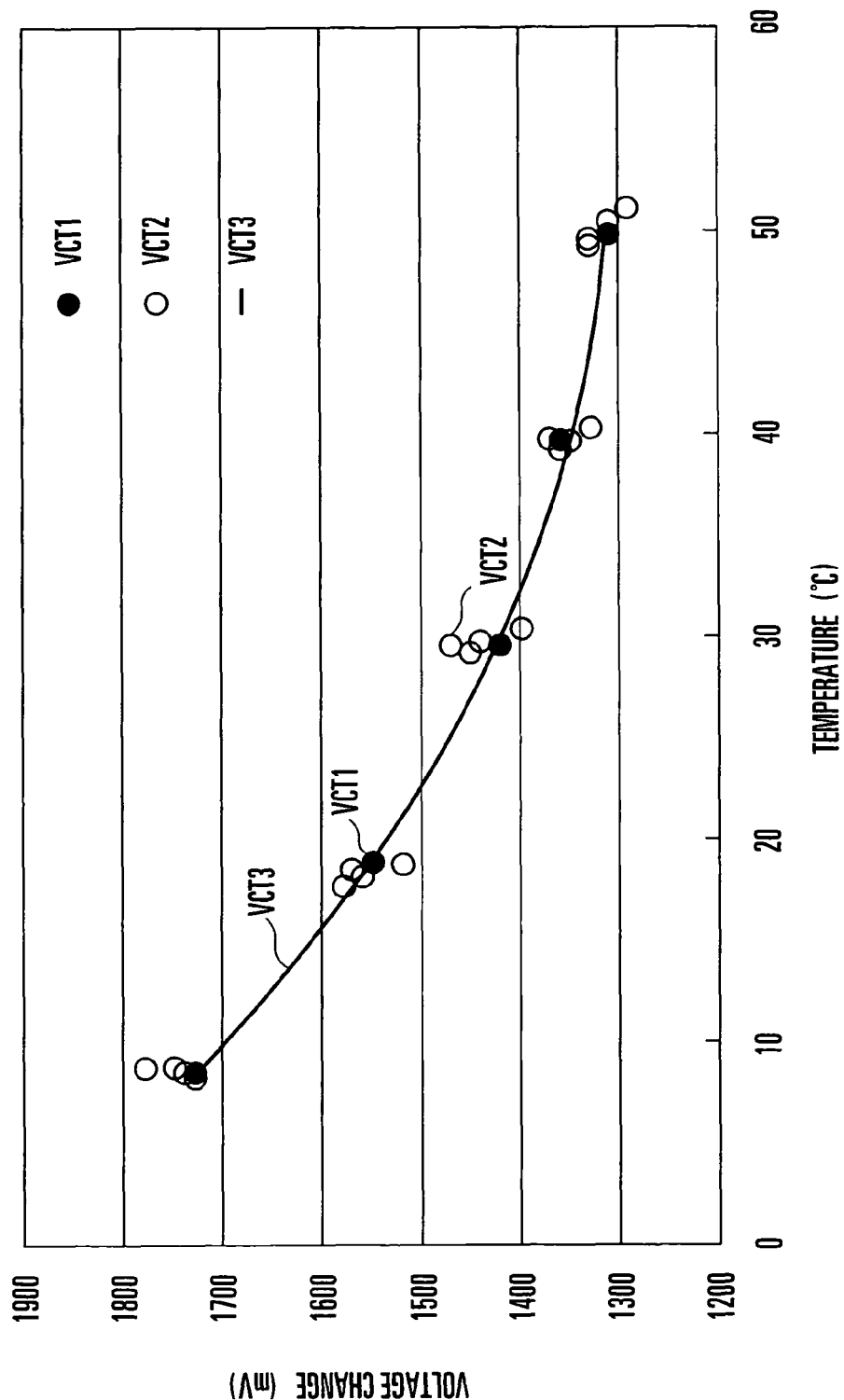
FIG. 5 is a graph showing the relationship between the surface temperature of the nickel metal hydride storage battery in the battery module at the end of charge and the voltage change of the battery module in one hr after the end of charge.

FIG. 1 is a graph showing the relationship between the surface temperature T of a nickel metal hydride storage battery in a battery module at the end of charge and the voltage change of the battery module in three min after the end of charge. FIG. 2 is a graph showing the relationship between the surface temperature T of the nickel metal hydride storage battery in the battery module at the end of charge and the voltage change of the battery module in five min after the end of charge. FIG. 3 is a graph showing the relationship between the surface temperature T of the nickel metal hydride storage battery in the battery module at the end of charge and the voltage change of the battery module in 10 min after the end of charge. FIG. 4 is a graph showing the relationship between the surface temperature T of the nickel metal hydride storage battery in the battery module at the end of charge and the voltage change of the battery module in 30 min after the end of charge. FIG. 5 is a graph showing the relationship between the surface temperature T of the nickel metal hydride storage battery in the battery module at the end of charge and the voltage change of the battery module in one hr after the end of charge. Referring FIGS. 1 to 5, reference symbol VCT1 denotes the measurement results on the surface temperature T at the end of charge and the voltage change at each time from the end of charge. Note that the voltage change value V of the above battery module was recorded at one-min intervals after the end of charge.

Likewise, a total of four battery modules of the same type each were caused to deteriorate by repetitive execution of self-discharge with a depth of discharge of about 20% at 50° C., 55° C., 60° C., and 65° C. and first-stage charging operation with a charging current of 20 A at 25° C. When the capacities of the four battery modules of the same type decreased below a replacement reference capacity value (70 Ah) due to self-discharge with a depth of discharge of about 20% and deterioration, the respective capacities were 69.3 Ah, 69.7 Ah, 68.7 Ah, and 69.6 Ah. In the four battery modules of the same type whose capacities decreased below the replacement reference capacity value (70 Ah), first-stage charging operation was executed after the ambient temperature was made constant, and the surface temperatures T of the nickel metal hydride storage batteries in the battery modules at the end of charge and the voltage change values V of the battery modules in a predetermined period of time after the end of charge were measured. In addition, measurement on the surface temperature T at the end of first-stage charging operation, which was executed while the ambient temperature was made constant, and the voltage change value V in a predetermined period of time after the end of charge was repeatedly executed in the ambient temperature range of each of the above battery modules from 10° C. to 50° C. Likewise, the above predetermined period of time was set to three min, five min, 10 min, 30 min, and one hr. Referring FIGS. 1 to 5, reference symbol VCT2 denotes the measurement results on the surface temperature T at the end of charge and the voltage change at each time from the end of charge in each of the four battery modules of the same type. Note that the voltage change value V of the above battery module was recorded at one-min intervals after the end of charge.

Referring to FIGS. 1 to 5, reference symbol VCT3 denotes the parabola optimized by the least squares method when the measurement result VCT1 is approximated by parabolic equation $f(T)=aT^2-bT+c$. In this case, coefficients a, b, and c of the parabolic equation f(T) obtained by optimizing the measurement results on the surface temperature T at the end of charge and the voltage change in 10 min after the end of charge by the least squares method were: a=0.201, b=21.91, and c=1766. A comparison with the measurement result VCT1 shown in FIGS. 1 to 5 indicates that there are large variations in measurement results on the surface temperature T at the end of charge and the voltage change in three min after the end of charge. This is because, since the voltage change value V is recorded at one-min intervals, an error of several sec may greatly influence the voltage change value V immediately after the end of charge at which a change in the voltage change value V is especially large. For this reason, the measurement result VCT1 shown in FIG. 1 is apart from the parabola represented by the parabolic equation f(T) optimized by the least squares method. In contrast, it is obvious that the measurement result VCT1 on the surface temperature T at the end of charge and the voltage change in five min after the end of charge exhibits small variations, and can be approximated by the parabolic equation f(T) optimized by the least squares method (FIG. 2).

A comparison between the measurement results VCT1 and VCT2 shown in FIGS. 1 to 5 indicates that the measurement result VCT2 on the surface temperature T at the end of charge and the voltage change in five min after the end of charge is not much apart from the parabola represented by the parabolic equation f(T) obtained by optimizing the measurement result VCT1 by the least squares method (FIG. 2). That is, as long as a battery module of the same type is used, the measurement result VCT1 can be optimized by the parabolic equation f(T). The measurement results VCT2 were obtained, from the four battery modules of the same type whose capacities decreased below the replacement reference capacity value (70 Ah) after they were caused to deteriorate at 50° C., 55° C., 60° C., and 65° C., by repeatedly executing the following measurement while ambient temperature around each of the above battery modules was changed between 10° C. and 50° C.: executing first-stage charging operation at a constant ambient temperature and measuring the surface temperature T of the nickel metal hydride storage battery in each of the battery modules at the end of charge and the voltage change value V of each of the battery modules in a predetermined period of time after the end of charge. This indicates that the temperatures at which the battery modules, i.e., the nickel metal hydride storage batteries, deteriorate have no influence on the measurement results VCT2.

Figure 6:
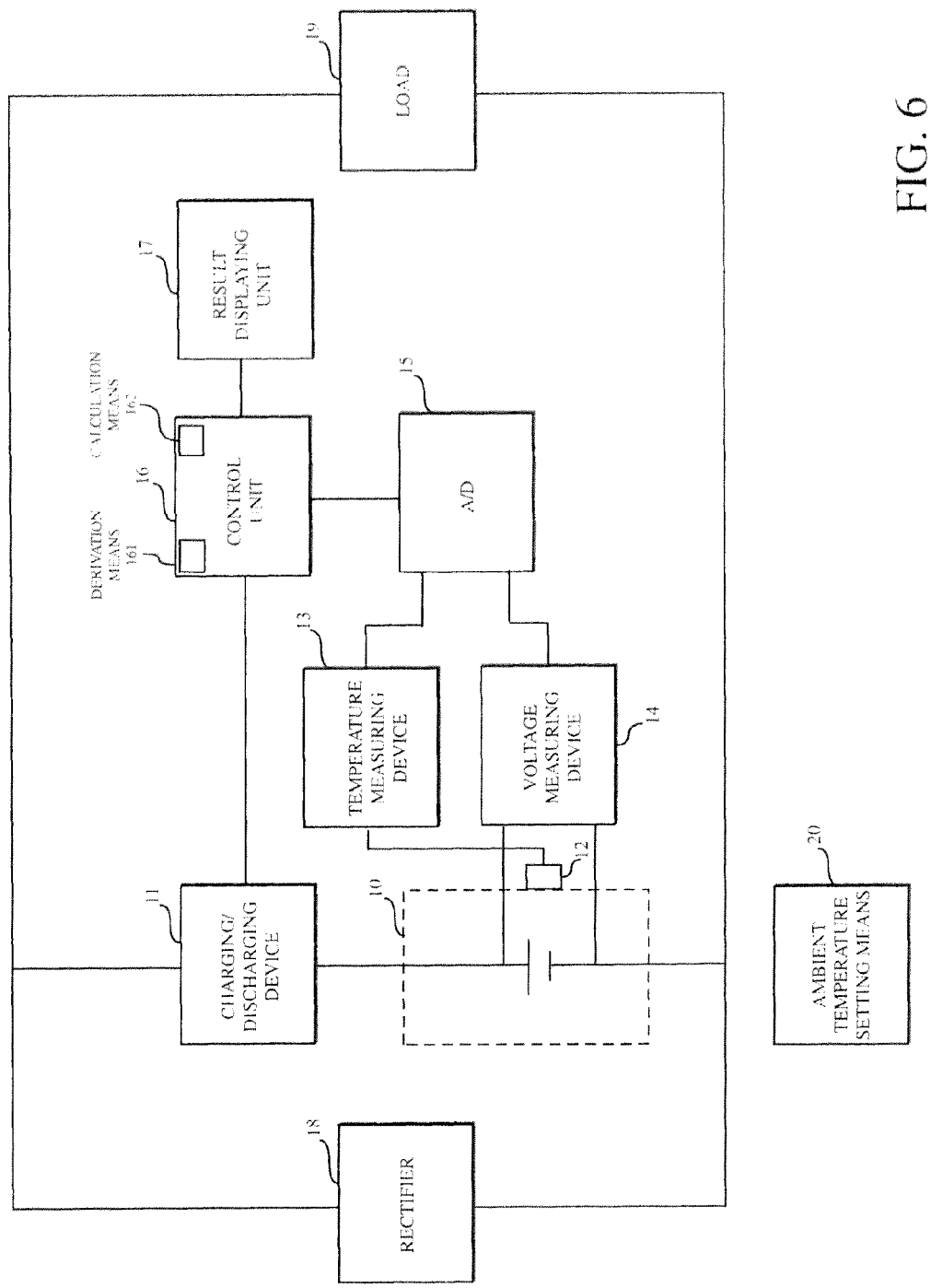
FIG. 6 is a block diagram showing the arrangement of a replacement determination device according to the first embodiment of the present invention.
Figure 7:
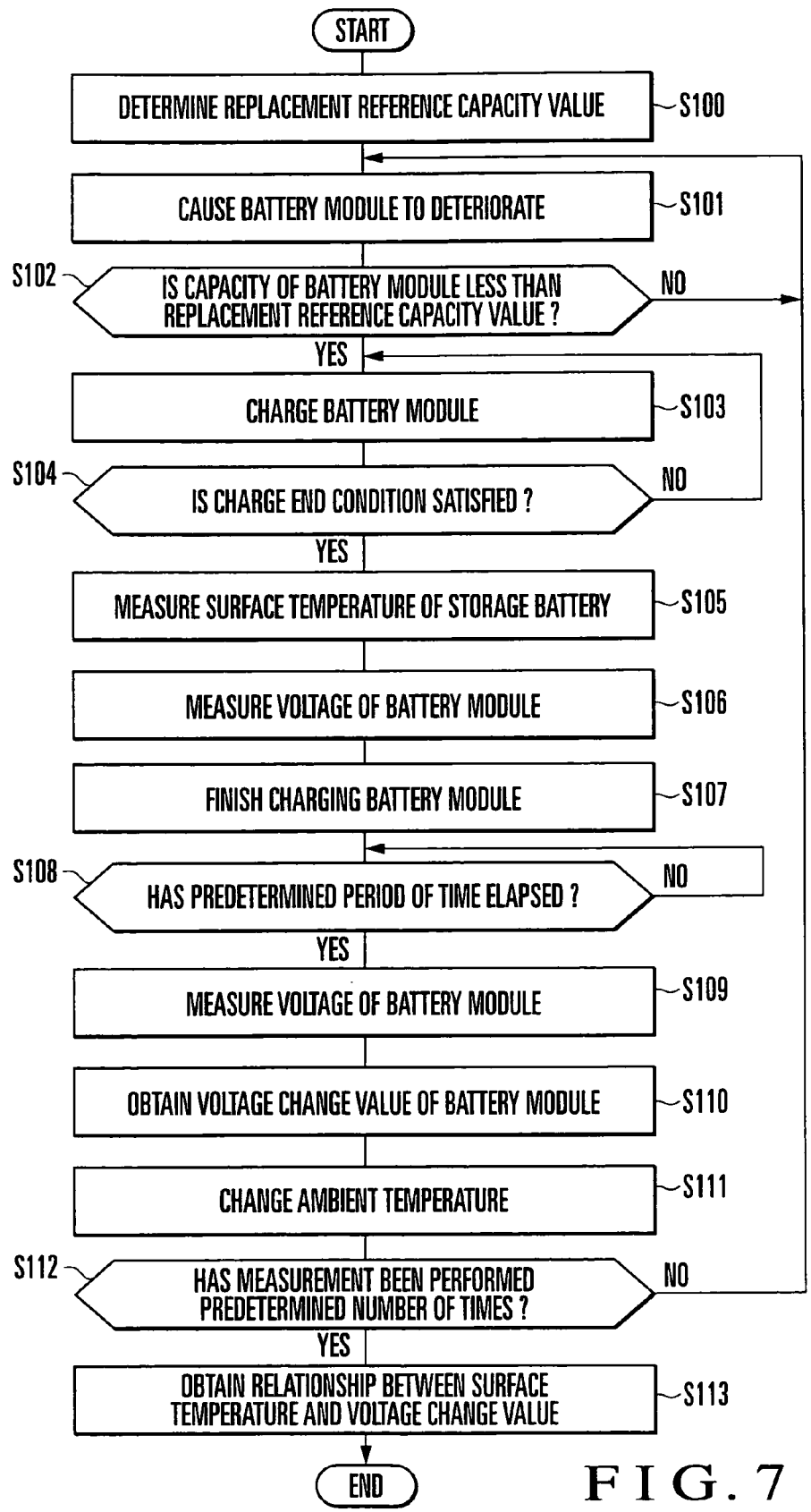
FIG. 7 is a flowchart showing the operation of the replacement determination device in FIG. 6.

The above experimental result shows that the replacement determination method for a battery module (nickel metal hydride storage battery) according to the present invention can be provided. FIG. 6 is a block diagram showing the arrangement of the replacement determination device according to the first embodiment of the present invention. FIGS. 7 and 8 are flowcharts showing the operation of the replacement determination device. FIG. 7 shows processing to be performed in advance by a battery module 10 before the execution of processing for another battery module 10 of the same time as a determination target. FIG. 8 shows replacement determination processing for the battery module 10 as the determination target.

The replacement determination device includes a charging/discharging device 11 which charges/discharges the battery module 10 comprising one or more nickel metal hydride storage batteries, a temperature measuring element 12 attached to a nickel metal hydride storage battery in the battery module 10, a temperature measuring device 13 which measures the surface temperature of the nickel metal hydride storage battery in the battery module 10 on the basis of an output from the temperature measuring device 12, a voltage measuring device 14 which measures the voltage of the battery module 10, an A/D converter 15 which converts the measurement results obtained by the temperature measuring device 13 and the voltage measuring device 14 into digital values, a control unit 16 which controls the charging/discharging device 11 and determines the necessity of replacement of the battery module 10 on the basis of the measurement results obtained by the temperature measuring device 13 and the voltage measuring device 14, and a result displaying unit 17 which displays the determination result obtained by the control unit 16. An ambient temperature setting means 20 can change the ambient temperature around the battery module 10.

A rectifier 18, the charging/discharging device 11, and the control unit 16 constitute a charging means. The voltage measuring device 14 forms a voltage measuring means. The temperature measuring element 12 and the temperature measuring device 13 constitute a temperature measuring means. The control unit 16 forms a determination means, a derivation means 161, and a calculation means 162.

The system in FIG. 6 is configured such that the battery module 10 is charged by an output from the rectifier 18 via the charging/discharging device 11 under the control of the control unit 16, and supplies power to a load 19 via the charging/discharging device 11.

The operation of the replacement determination device according to this embodiment will be described below with reference to FIGS. 7 and 8. First of all, the user of the replacement determination device determines, in advance, a replacement reference capacity value as a criterion based on which a given battery module 10 is replaced when it deteriorates (step S100 in FIG. 7). Subsequently, the control unit 16 controls the charging/discharging device 11 to make the battery module 10 deteriorate by repeating self-discharge and first-stage charging operation (step S101).

The control unit 16 measures the voltage of the battery module 10 by using the voltage measuring device 14, and obtains the internal impedance of the nickel metal hydride storage battery in the battery module 10, thereby obtaining the capacity of the battery module 10. If the capacity of the battery module 10 is less than the replacement reference capacity value (YES in step S102), the control unit 16 makes the ambient temperature constant and executes first-stage charging operation (step S103).

If a predetermined charge end condition is satisfied (YES in step S104), the control unit 16 measures the surface temperature T of the nickel metal hydride storage battery in the battery module 10 at the end of charge by using the temperature measuring device 13 (step S105), measures the voltage of the battery module 10 at the end of charge by using the voltage measuring device 14 (step S106), and finishes charging the battery module 10 (step S107).

Subsequently, when a predetermined period of time has elapsed since the end of charge (YES in step S108), the control unit 16 measures the voltage of the battery module 10 by using the voltage measuring device (step S109). The control unit 16 then obtains the difference between the voltage value of the battery module 10 at the end of charge and the voltage value of the battery module 10 in the lapse of a predetermined period of time from the end of charge, i.e., the voltage change value V of the battery module 10 in a predetermined period of time from the end of charge (step S110).

The control unit 16 changes the ambient temperature around the battery module 10 by using the ambient temperature setting means 20, and sets a constant ambient temperature different from the previous temperature (step S111). The control unit 16 then performs measurement in steps S101 to S111. In this manner, the control unit 16 performs measurement at each of different ambient temperatures.

When measurement is performed a predetermined number of times (YES in step S112), the control unit 16 derives the relationship between the surface temperature T of the nickel metal hydride storage battery in the battery module 10 at the end of charge and the voltage change value V of the battery module 10 after a predetermined period of time from the end of charge (step S113). That is, the control unit 16 obtains the coefficients a, b, and c of parabolic equation $f(T)=aT^2-bT+c$ obtained by optimizing the measurement result using the least squares method.

Replacement determination processing for the battery module 10 as a determination target will be described next with reference to FIG. 8. The control unit 16 executes first-stage charging operation and second-stage charging operation at a constant ambient temperature for the battery module 10 as the determination target (step S200 in FIG. 8). If a predetermined charge end condition for the first-stage charging operation is satisfied (YES in step S201), the control unit 16 measures a surface temperature T0 of the nickel metal hydride storage battery in the battery module 10 as the determination target at the end of the first-stage charging operation by using the temperature measuring device 13 (step S202). The control unit 16 measures the voltage of the battery module 10 as the determination target at the end of the first-stage charging operation by using the voltage measuring device 14 (step S203). The control unit 16 finishes the first-stage charging operation for the battery module 10 as the determination target (step S204).

Subsequently, when a predetermined period of time has elapsed since the end of the first-stage charging operation (YES in step S205), the control unit 16 measures the voltage of the battery module 10 as the determination target by using the voltage measuring device 14 (step S206). The control unit 16 obtains the difference between the voltage value of the battery module 10 as the determination target at the end of the first-stage charging operation and the voltage value of the battery module 10 as the determination target after the lapse of a predetermined period of time from the end of the first-stage charging operation, i.e., a voltage change value Vm of the battery module 10 as the determination target in a predetermined period of time after the end of the first-stage charging operation (step S207).

The control unit 16 then substitutes the surface temperature T0 of the nickel metal hydride storage battery in the battery module 10 as the determination target at the end of the first-stage charging operation into parabolic equation $f(T)=aT^2-bT+c$, and sets a voltage change value $f(T)$ as the calculation result obtained by the substitution to the reference voltage change value V0 (step S208). The control unit 16 compares the voltage change value Vm obtained in step S207 with the reference voltage change value V0 (step S209).

If the voltage change value Vm is less than the reference voltage change value V0 (NO in step S209), the control unit 16 determines that there is no need to replace the battery module 10, and terminates the replacement determination processing in FIG. 8. If the voltage change value Vm is equal to or more than the reference voltage change value V0 (YES in step S209), the control unit 16 also determines that the battery module 10 as the determination target needs to be replaced, and displays, on the result displaying unit 17, a determination result indicating that the battery module 10 needs to be replaced (step S210).

As described above, this embodiment can be applied to any system configuration because a nickel metal hydride storage battery in a battery module does not discharge when the necessity of replacement of the battery module is to be determined. The embodiment determines a replacement reference capacity value in advance, and determines the necessity of replacement of a battery module as a determination target from the parabolic equation $f(T)$ optimized by the least squares method on the basis the relationship between the surface temperature T of the nickel metal hydride storage battery in the battery module at the end of charge at which the capacity value becomes less than the replacement reference capacity value and the voltage change value V of the battery module in a predetermined period of time after the end of charge, the surface temperature T0 of the nickel metal hydride storage battery in the battery module as the determination target which is measured at the end of charge, and the voltage change value Vm of the battery module as the determination target in a predetermined period of time after the end of charge. Therefore, no error occurs in replacement determination for the battery module due to a temperature change, thereby preventing the occurrence of an error in replacement determination.

In addition, in this embodiment, since the relationship between the surface temperature T at the end of charge and the voltage change value V in a predetermined period of time after the end of charge is approximated by parabolic equation $f(T)=aT^2-bT+c$ optimized by the least squares method, the reference voltage change value V0 can be easily calculated. This makes it possible to easily determine the necessity of replacement of the battery module as the determination target. The embodiment need not correct a voltage change value due to a temperature at the time of charge, and requires no complicated mathematical expression or table. This can easily determine the necessity of replacement of the battery module as the determination target.

Figure 9:
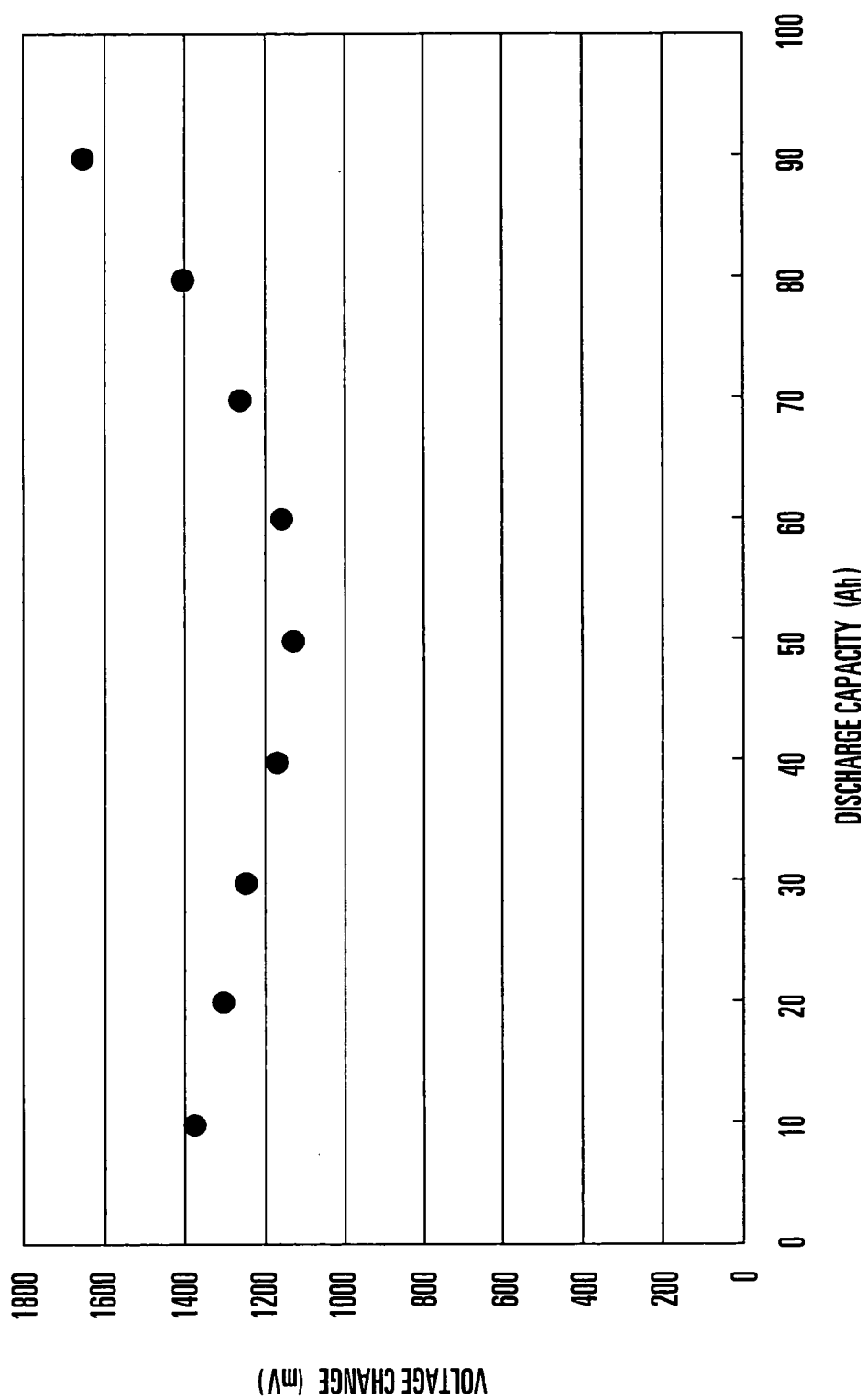
FIG. 9 is a graph showing the relationship between the discharge capacity of a battery and the voltage change of the battery module in 10 min after the start of charge.

Note that the following operation was repeated: fully charging a non-deteriorated battery module of the same type as that of a deteriorated battery module used in this embodiment, discharging the module in increments of a discharge capacity of 10 Ah from 10 Ah to 90 Ah, and fully charging the module again with 20 Ah. FIG. 9 is a graph showing the relationship between the voltage rise value of the battery module in 10 min after the start of charge and the discharge capacity.

As is obvious from FIG. 9, the voltage rise value of the battery module at the start of charge greatly changes depending on the depth of discharge. For this reason, as long as it is not clearly known that the depth of discharge is constant, when a battery module is fully charged in an environment in which the ambient temperature changes, it is difficult to determine the deterioration of the battery module from the voltage rise value of the battery module at the start of charge. In addition, in the environment in which the ambient temperature changes, since the self-discharge rate of the battery module changes, the self-discharge amount is not constant even in a constant time. For this reason, it is difficult to determine the deterioration of the battery module from the voltage change of the battery module at the start of charge.

Second Embodiment

A device and method for determining replacement of a battery system according to the second embodiment will be described next. Differences from the first embodiment will be mainly described with reference to FIG. 10. Note that the replacement determination device and method according to the second embodiment are basically the same as those according to the first embodiment.

In this embodiment, a determination target is a battery system in which four battery modules, each having a nominal capacity of 95 Ah, with 10 nickel metal hydride storage battery cells being connected in series with each other, are connected in series with each other. As in the first embodiment, the replacement determination device for a battery system according to the second embodiment obtains parabolic equation $f(T)=aT^2-bT+c$ in advance, measures surface temperatures T0 of the four battery modules connected in series with each other at the end of charge and voltage change values Vm of the modules in a predetermined period of time after the end of charge, and determines the necessity of replacement of the battery system. Therefore, the device and method for determining replacement of a battery system according to this embodiment can also acquire the same effects as those of the first embodiment.

Figure 10:
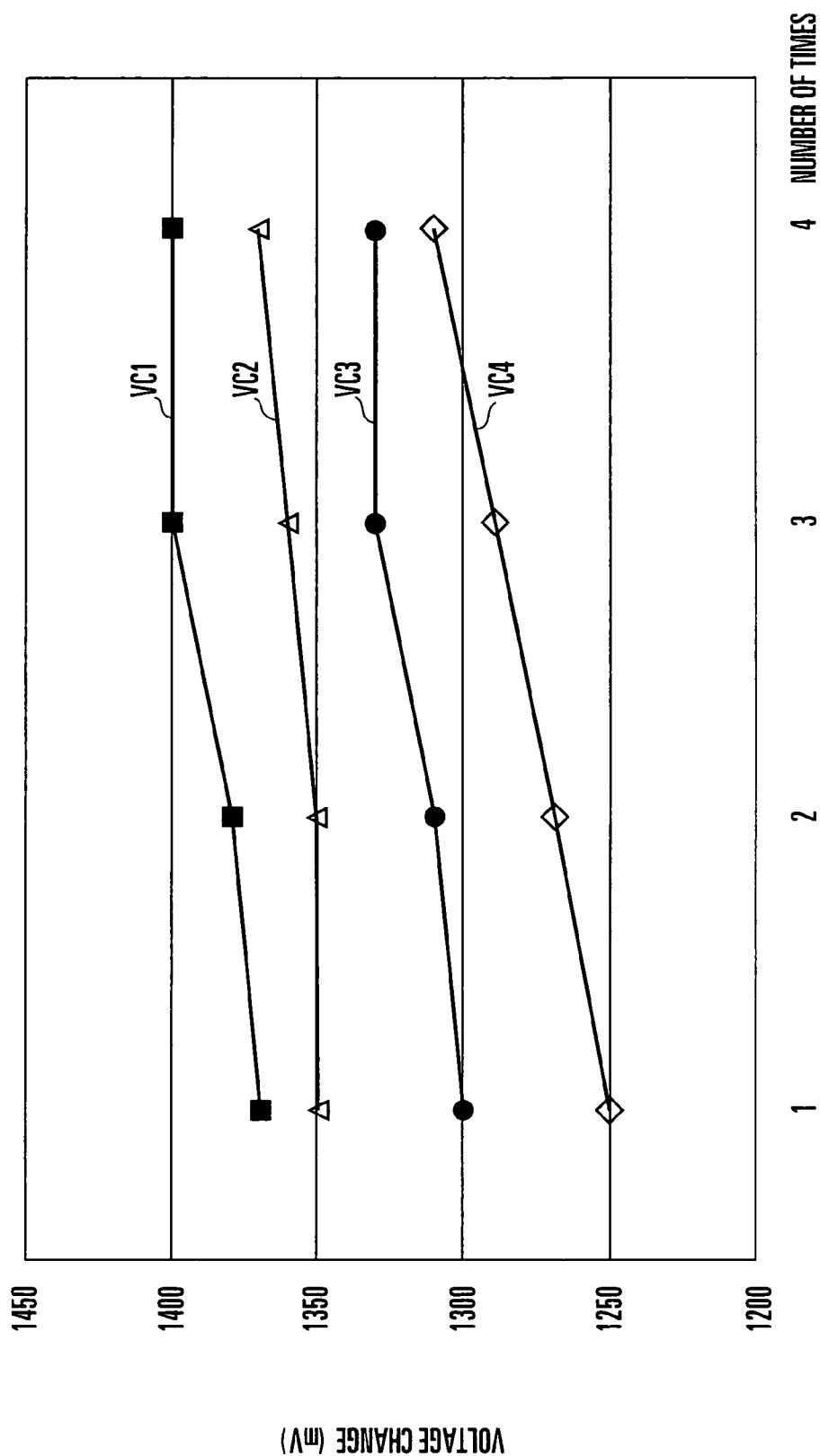
FIG. 10 is a graph showing the results obtained by measuring the voltage changes of four battery modules connected in series with each other consecutively four times in 10 min from the end of charge.

In addition, the device for determining replacement of a battery system according to this embodiment repeated the following cycle four times: executing first-stage charging operation with a charging current of 20 A at 25° C., measuring the voltage of each battery module after the lapse of 10 min from the end of the first-stage charging operation, leaving each module left standing for one month at 25° C., and then charging each module, and measured voltage changes in 10 min after the end of each charge. FIG. 10 shows the measurement results obtained by measuring the voltage changes of the four battery modules connected in series with each other consecutively four times, in 10 min from the end of charge. Referring to FIG. 10, reference symbols VC1, VC2, VC3, and VC4 denote the measurement results on the respective battery modules of the battery system.

As shown in FIG. 10, in the battery system according to this embodiment, there are variations in voltage change among battery modules. If, therefore, the necessity of replacement is determined from a voltage change value Vm of only one specific battery module, it may be determined that a battery module which has already been required to be replaced need not be replaced.

A control unit 16 of the replacement determination device of this embodiment performs the replacement determination processing shown in FIG. 8 for each battery module of the battery system. If the voltage change values Vm of a predetermined number of (e.g., two or more) battery modules, of the four battery modules connected in series with each other, become equal to or more than a reference voltage change value V0, the control unit 16 determines that the battery system needs to be replaced. This makes it possible to properly determine in one operation that the four battery modules connected in series with each other need to be replaced. Therefore, this embodiment can reduce determination errors due to variations among a plurality of battery modules, and can accurately determine, in one operation, the necessity of replacement of the battery modules.

Third Embodiment

The differences between a device and method for determining replacement of a battery system according to the third embodiment of the present invention and those according to the second embodiment will be mainly described. Note that the replacement determination device and method according to this embodiment are basically the same as those according to the second embodiment.

As in the second embodiment, in this embodiment, a determination target is a battery system in which four battery modules, each having a nominal capacity of 95 Ah, with 10 nickel metal hydride storage battery cells being connected in series with each other, are connected in series with each other. As in the second embodiment, the device for determining replacement of a battery system according to the third embodiment obtains parabolic equation $f(T)=aT^2-bT+c$ in advance, measures surface temperatures T0 of the four battery modules connected in series with each other at the end of charge and voltage change values Vm of the modules in a predetermined period of time after the end of charge, and determines the necessity of replacement of the battery system from the measurement results and the parabolic equation f(T).

Therefore, the device and method for determining replacement of a battery system according to this embodiment can also acquire the same effects as those of the first embodiment.

The device for determining replacement of a battery system according to this embodiment measures surface temperatures T0 of the four battery modules connected in series with each other at the end of charge and voltage change values Vm of the modules in a predetermined period of time after the end of charge, and hence the surface temperatures T0 and the voltage change values Vm as measurement results include measurement errors based on the accuracies of the respective measurements. Such measurement errors are causes of replacement determination errors. If the measured surface temperature T0 is higher than the true value, it is determined that the battery which need not be replaced needs to be replaced. In contrast, if the measured surface temperature T0 is lower than the true value, it is determined that the battery which needs to be replaced need not be replaced. Determining the necessity of replacement of a battery in one operation will cause erroneous determination if the measured value of the surface temperature T0 is abnormal.

For this reason, a control unit 16 of the replacement determination device according to this embodiment determines that the battery system needs to be replaced, if the voltage change values Vm of a predetermined number of (e.g., two or more) battery modules, of the four battery modules connected in series with each other, become equal to or more than a reference voltage change value V0 consecutively three times. This can reduce determination errors due to measurement errors.

Assume that the voltage change values Vm of two or more battery modules of the four battery modules connected in series with each other become equal to or more than the reference voltage change value V0 once or consecutively two times. Assume also that the voltage change values of two or more battery modules of the four battery modules connected in series with each other do not become equal to or more than the reference voltage change value V0 because of abnormality in the measured values of the voltage change values Vm or the surface temperatures T0, and hence it is determined that battery modules which need to be replaced need not be replaced. Even in this case, although replacement determination delays, in consideration of the frequency of charge, i.e., about one per month, it is unlikely that the capacities greatly decrease during this period. Therefore, no practical problem arises.

Note that the above embodiments are merely examples of embodiments of the present invention, and the scope of the present invention is not limited to them. The present invention can be applied to various other embodiments within the scope described in the claims. For example, in the first to third embodiments, the replacement determination device and method of the present invention are applied to the battery module in which the 10 nickel metal hydride storage battery cells are connected in series with each other. However, the present invention is not limited to this. The replacement determination device and method of the present invention can be applied to the battery module in which the 10 nickel metal hydride storage battery cells are connected in parallel with each other.

In the second and third embodiments, the replacement determination device and method of the present invention are applied to the battery system in which the four battery modules are connected in series with each other. However, the present invention is not limited to this, and similar effects can be acquired by applying the present invention to a battery system in which battery modules are connected in parallel with each other.

In the third embodiment, the replacement determination device and method according to the present invention are applied to a battery system in which four battery modules are connected in series with each other. However, the present invention is not limited to this, and similar effects can be obtained by applying the present invention to a battery system to which one battery module is connected.

In the first embodiment, the replacement determination device and method according to the present invention are applied to the battery module in which the 10 nickel metal hydride storage battery cells are connected in series with each other. However, the present invention is not limited to this, and can be applied to a single nickel metal hydride storage battery. In this case, it suffices to determine that a nickel metal hydride storage battery as a determination target needs to be replaced in the following case. A replacement reference capacity value as a reference capacity for the replacement of a nickel metal hydride storage battery is determined in advance. A nickel metal hydride storage battery whose capacity has become less than the replacement reference capacity value is charged at a constant ambient temperature, and the surface temperature of the battery at the end of charge and a voltage change value in a predetermined period of time after the end of charge are measured. In addition, the above measurement is repeatedly executed while the ambient temperature is changed, thereby obtaining the relationship between surface temperatures and voltage change values. The surface temperature of the nickel metal hydride storage battery as the determination target at the end of charge and a voltage change value in a predetermined period of time after the end of charge measured. A reference voltage change value is calculated from the above relationship and the surface temperature. The voltage change value is equal to or more than the reference voltage change value.

Likewise, in the second and third embodiments, the replacement determination device and method according to the present invention are applied to the battery system in which the four battery modules are connected in series with each other. However, the present invention is not limited to this, and the replacement determination devices and methods according to the second and third embodiments can be applied to a plurality of nickel metal hydride storage batteries.

In the third embodiment, the replacement determination device and method according to the present invention are applied to the battery system in which the four battery modules are connected in series with each other. However, the present invention is not limited to this, and the replacement determination device and method according to the third embodiment can be applied to a single nickel metal hydride storage battery.

In the first to third embodiments, in a battery module as a determination target, after first-stage charging operation is executed until the nickel metal hydride storage battery is fully charged by the intermittent charge method, and second-stage charging operation is executed with a low current. However, the present invention is not limited to this, and the second-state charging operation need not be performed.

In the first to third embodiments, a battery module whose capacity has become less than a replacement reference capacity value is fully charged, and the surface temperature T of the nickel metal hydride storage battery in the battery module at the end of charge and the voltage change value V in a predetermined period of time after the end of charge are measured in advance. However, the present invention is not limited to this. The control unit 16 of the replacement determination device may obtain the relationship between the surface temperature and the voltage change value by repeatedly executing the following measuring operation while changing the ambient temperature: starting charging a nickel metal hydride storage battery or battery module whose capacity has become less than a replacement reference capacity value at a constant ambient temperature, interrupting the charge when a surface temperature rise per unit time becomes equal to or more than a predetermined value, and measuring a surface temperature at the time of interruption and a voltage change value in a predetermined period of time after the interruption. In this case, similar effects can be acquired if the control unit 16 interrupts charging of a nickel metal hydride storage battery or battery module as a determination target when the surface temperature rise per unit time becomes equal to or more than a predetermined value after the start of charge, and measures a surface temperature at the time of interruption and a voltage change value in a predetermined period of time after the interruption.

In the first to third embodiments, FIGS. 1 to 5 show the relationships obtained when the predetermined period of time is set to three min, five min, 10 min, 30 min, and one hr as the relationships between the surface temperatures T at the end of charge and the voltage change value V in a predetermined period of time after the end of charge. The present invention is not limited to this, and the predetermined period of time may be set to other times. Note that the predetermined period of time is preferably set to five min to one hr. This setting makes it possible to quickly determine the necessity of replacement of a nickel metal hydride storage battery or battery module while reducing variations in the surface temperature T at the end of charge and the voltage change value V in a predetermined period of time after the end of charge.

In the first to third embodiments, the replacement reference capacity value is set to 70 Ah. Obviously, however, the present invention is not limited to this, and this value can be set to another value.

In the first to third embodiments, the relationship between the surface temperature T and the voltage change value V is obtained by repeatedly executing the following measuring operation while changing the ambient temperature: charging a battery module whose capacity has become less than the replacement reference capacity value at a constant ambient temperature, and measuring the surface temperature T of the nickel metal hydride storage battery in the battery module whose capacity is less than the replacement reference capacity value at the end of charge and the voltage change value V in a predetermined period of time after the end of charge. This relationship is then approximated by parabolic equation $f(T) = aT^2 - bT + c$. However, the present invention is not limited to this, and the relationship can be approximated by another function $f(T)$.

Note that the control unit 16 in the first to third embodiments can be implemented by, for example, a computer including a CPU, storage device, and interface and programs which control these hardware resources. Programs for operating such a computer are provided while being recorded on a recording medium such as a flexible disk, CD-ROM, DVD-ROM, or memory card. The CPU writes a read program in the storage device, and executes processing described in the first to third embodiments in accordance with the program.

INDUSTRIAL APPLICABILITY

The present invention can be applied to the technique of determining replacement of a storage battery.

The invention claimed is:

1. A device for determining replacement of a storage battery comprising:
    charging means for charging not less than one storage battery as a determination target;
    voltage measuring means for measuring a voltage change value of the storage battery in a predetermined period of time after the end of charging the storage battery; and
    temperature measuring means for measuring a surface temperature of the storage battery at the end or an intermediate interruption of charging thereof;
    derivation means for obtaining a relationship between the surface temperature of the storage battery measured by said temperature measuring means and the voltage change value of the storage battery;
    calculation means for calculating a reference voltage change value based on the relationship between the measured surface temperature and the measured voltage change value of the storage battery and based on said measured surface temperature when the residual capacity of the storage battery is less than a replacement reference capacity; and
    determination means for determining that the storage battery needs to be replaced, when the voltage change value has become not less than a reference voltage change value consecutively a predetermined number of times which is not less than one.

2. A device for determining replacement of a storage battery according to claim 1, wherein the end of charging the storage battery is when a predetermined charge end condition is satisfied.

3. A device for determining replacement of a storage battery according to claim 1, wherein the end of charging the storage battery is when a surface temperature rise of the storage battery per unit time becomes not less than a predetermined value after the start of charge, and the charge is interrupted.

4. A device for determining replacement of a storage battery according to claim 3, comprising
    the temperature measuring means for measuring the surface temperature of the storage battery at the time of the intermediate interruption of charge,
    derivation means for obtaining a relationship between the surface temperature of the storage battery measured by said temperature measuring means and the voltage change value of the storage battery, and
    the calculation means for calculating the reference voltage change value used in said determination means from the relationship obtained by said derivation means,
    wherein said charging means charges the storage battery whose capacity has become less than a replacement reference capacity value as a reference capacity for replacement of the storage battery, at a constant ambient temperature, before the voltage change value of the storage battery as the determination target is measured, and interrupts charge of the storage battery when a surface temperature rise of the storage battery per unit time becomes not less than a predetermined value,
    said temperature measuring means measures the surface temperature of the storage battery whose capacity is less than the replacement reference capacity value at the time of interruption of charge,
    said voltage measuring means measures the voltage change value of the storage battery whose capacity is less than the replacement reference capacity value in a predetermined period of time from the time of interruption of charge, and said derivation means obtains a relationship between the surface temperature of the storage battery whose capacity is less than the replacement reference capacity value and the voltage change value from results obtained by repeatedly charging the storage battery whose capacity is less than the replacement reference capacity value and measuring the surface temperature and the voltage change value of the storage battery while changing an ambient temperature.

5. A device for determining replacement of a storage battery according to claim 4, wherein said derivation means approximates said relationship between the surface temperature of the storage battery whose capacity is less than the replacement reference capacity value and the voltage change value thereof by a function f(T), where T represents the surface temperature of the storage battery measured by said temperature measuring means.

6. A device for determining replacement of a storage battery according to claim 5, wherein the function f(T) is parabolic equation $f(T)=aT^2-bT+c$ optimized by a least squares method.

7. A device for determining replacement of a storage battery according to claim 5, wherein
said temperature measuring means comprises measures the surface temperature T of the storage battery as the determination target at the time of interruption of charge, and
said calculation means calculates the reference voltage change value by substituting the surface temperature T of the storage battery as the determination target, measured by said temperature measuring means, into the function f(T).

8. A device for determining replacement of a storage battery according to claim 1, further comprising
the temperature measuring means for measuring the surface temperature of the storage battery at the end of charge, and
the calculation means for calculating the reference voltage change value used in said determination means from the relationship obtained by said derivation means,
wherein said charging means charges the storage battery whose capacity has become less than a replacement reference capacity value as a reference capacity for replacement of the storage battery at a constant ambient temperature, before the voltage change value of the storage battery as the determination target is measured,
said temperature measuring means measures the surface temperature of the storage battery whose capacity is less than the replacement reference capacity value at the end of charge,
said voltage measuring means measures the voltage change value of the storage battery whose capacity is less than the replacement reference capacity value in a predetermined period of time from the end of charge, and
said derivation means obtains a relationship between the surface temperature of the storage battery whose capacity is less than the replacement reference capacity value and the voltage change value from results obtained by repeatedly charging the storage battery whose capacity is less than the replacement reference capacity value and measuring the surface temperature and the voltage change value of the storage battery while changing an ambient temperature.

9. A device for determining replacement of a storage battery according to claim 8, wherein said derivation approximates said relationship between the surface temperature of the storage battery whose capacity is less than the replacement reference capacity value and the voltage change value thereof by a function f(T), where T represents the surface temperature of the storage battery measured by said temperature measuring means.

10. A device for determining replacement of a storage battery according to claim 9, wherein the function f(T) is parabolic equation $f(T)=aT^2-bT+c$ optimized by a least squares method.

11. A device for determining replacement of a storage battery according to claim 9, wherein
said temperature measuring means measures the surface temperature T of the storage battery as the determination target at the end of charge, and
said calculation means calculates the reference voltage change value by substituting the surface temperature T of the storage battery as the determination target, measured by said temperature measuring means, into the function f(T).

12. A device for determining replacement of a storage battery according to claim 1, wherein said determination means comprises means for determining that the storage battery needs to be replaced, when the voltage change values of a predetermined number of storage batteries, of a plurality of storage batteries as the determination targets, become not less than the reference voltage change value.

13. A device for determining replacement of a storage battery according to claim 1, wherein the predetermined period of time is any one of five min to one hr.

14. A method for determining replacement of a storage battery comprising:
a first charging step of charging not less than one storage battery as a determination target;
a first voltage measuring step of measuring a voltage change value of the storage battery in a predetermined period of time after the end of charging the storage battery;
a first temperature measuring step of measuring a surface temperature of the storage battery at the end or an intermediate interruption of charging thereof;
a derivation step of obtaining a relationship between a surface temperature of the storage battery whose capacity, is less than the replacement reference capacity value and a voltage change value from results obtained by repeatedly executing the second charging step, the first temperature measuring step, and the second voltage measuring step while changing an ambient temperature;
a calculation step for calculating a reference voltage change value based on the relationship between the measured surface temperature and the measured voltage change value of the storage battery and based on said measured surface temperature when the residual capacity of the storage battery is less than a replacement reference capacity; and
a determination step of determining that the storage battery needs to be replaced, when the voltage change value has become not less than a reference voltage change value consecutively a predetermined number of times which is not less than one.

15. A method for determining replacement of a storage battery according to claim 14, wherein the end of charging the storage battery is when a predetermined charge end condition is satisfied.

16. A method for determining replacement of a storage battery according to claim 14, wherein the end of charging the storage battery is when a surface temperature rise of the storage battery per unit time becomes not less than a predetermined value after the start of charge, and the charge is interrupted.

17. A method for determining replacement of a storage battery according to claim 16, further comprising, before the first charging step, the first voltage measuring step, the first temperature measuring step, the calculation step, and the determination step,
- the second charging step of charging, at a constant ambient temperature, the storage battery whose capacity is not less than a replacement reference capacity value as a reference capacity for replacement of a storage battery, and interrupting the charge when a surface temperature rise of the storage battery per unit time becomes not less than a predetermined value,
- the first temperature measuring step of measuring, at the time of the intermediate interruption of charge, the surface temperature of the storage battery whose capacity is less than the replacement reference capacity value,
- the second voltage measuring step of measuring a voltage change value of the storage battery whose capacity is less than the replacement reference capacity value in a predetermined period of time from the time of the intermediate interruption of charge,
- the derivation step of obtaining a relationship between a surface temperature of the storage battery whose capacity is less than the replacement reference capacity value and a voltage change value from results obtained by repeatedly executing the second charging step, the second temperature measuring step, and the second voltage measuring step while changing an ambient temperature, and
- the calculation step of calculating the reference voltage change value used in the determination step from the relationship obtained in the derivation step at the time of the intermediate interruption of charge of the storage battery as the determination target.

18. A method for determining replacement of a storage battery according to claim 17, wherein the derivation step includes the step of approximating the relationship between the surface temperature of the storage battery whose capacity is less than the replacement reference capacity value and the voltage change value thereof by a function f(T), where T represents the surface temperature of the storage battery measured in the second temperature measuring step.

19. A method for determining replacement of a storage battery according to claim 18, wherein the function f(T) is parabolic equation $f(T)=aT^24-bT+c$ optimized by a least squares method.

20. A method for determining replacement of a storage battery according to claim 18, further comprising the second temperature measuring step of measuring the surface temperature of the storage battery as the determination target at the time of interruption of charge,
- wherein the calculation step includes the step of calculating the reference voltage change value by substituting the surface temperature T of the storage battery as the determination target, measured in the second temperature measuring step, into the function f(T).

21. A method for determining replacement of a storage battery according to claim 14, further comprising, before the first charging step, the first voltage measuring step, the first temperature measuring step, the calculation step, and the determination step,
- the second charging step of charging, at a constant ambient temperature, the storage battery whose capacity is not less than a replacement reference capacity value as a reference capacity for replacement of a storage battery,
- the first temperature measuring step of measuring, at the end of charge, the surface temperature of the storage battery whose capacity is less than the replacement reference capacity value,
- the second voltage measuring step of measuring the voltage change value of the storage battery whose capacity is less than the replacement reference capacity value in a predetermined period of time from the end of charge, and
- the calculation step of calculating the reference voltage change value used in the determination step from the relationship obtained in the derivation step at the stoppage of charge of the storage battery as the determination target.

22. A method for determining replacement of a storage battery according to claim 21, wherein the derivation step includes the step of approximating the relationship between the surface temperature of the storage battery whose capacity is less than the replacement reference capacity value and the voltage change value thereof by a function f(T), where T represents the surface temperature of the storage battery measured in the second temperature measuring step.

23. A method for determining replacement of a storage battery according to claim 22, wherein the function f(T) is parabolic equation $f(T)=aT^2-bT+c$ optimized by a least squares method.

24. A method for determining replacement of a storage battery according to claim 22, further comprising the second temperature measuring step of measuring the surface temperature T of the storage battery as the determination target at the end of charge,
- wherein the calculation step includes the step of calculating the reference voltage change value by substituting the surface temperature T of the storage battery as the determination target, measured in the second temperature measuring step, into the function f(T).

25. A method for determining replacement of a storage battery according to claim 14, wherein the determination step includes the step of determining that the storage battery needs to be replaced, when the voltage change values of a predetermined number of storage batteries, of a plurality of storage batteries as the determination targets, become not less than the reference voltage change value.

26. A method for determining replacement of a storage battery according to claim 14, wherein the predetermined period of time is any one of five minutes to one hour.

* * * * *